(12) United States Patent
Mueller et al.

(10) Patent No.: US 7,083,490 B2
(45) Date of Patent: Aug. 1, 2006

(54) LIGHT-EMITTING DEVICES UTILIZING NANOPARTICLES

(75) Inventors: Gerd O. Mueller, San Jose, CA (US); Regina B. Mueller-Mach, San Jose, CA (US); Dietrich Bertram, Aachen (DE); Thomas Juestel, Aachen (DE); Peter J. Schmidt, Aachen (DE); Joachim Opitz, Aachen (DE)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 19 days.

(21) Appl. No.: 11/033,594

(22) Filed: Jan. 11, 2005

(65) Prior Publication Data

US 2005/0215164 A1    Sep. 29, 2005

Related U.S. Application Data

(62) Division of application No. 10/165,571, filed on Jun. 7, 2002, now Pat. No. 6,870,311.

(51) Int. Cl.
*H01J 9/00* (2006.01)
*H01J 9/24* (2006.01)

(52) U.S. Cl. ............................. 445/24; 445/26; 438/34; 313/498; 313/503

(58) Field of Classification Search .................. 445/24, 445/25, 26; 313/498, 501, 503, 504; 257/98, 257/99, 100; 438/29, 34, 35
See application file for complete search history.

(56) References Cited

U.S. PATENT DOCUMENTS

| 5,777,433 | A | 7/1998 | Lester et al. |
|---|---|---|---|
| 5,813,753 | A | 9/1998 | Vriens et al. |
| 5,959,316 | A | 9/1999 | Lowery |
| 6,133,589 | A | 10/2000 | Krames et al. |
| 6,229,160 | B1 | 5/2001 | Krames et al. |
| 6,486,499 | B1 | 11/2002 | Krames et al. |
| 6,501,091 | B1 | 12/2002 | Bawendi et al. |
| 6,650,044 | B1 | 11/2003 | Lowery |
| 6,803,719 | B1 | 10/2004 | Miller et al. |
| 2002/0030194 | A1 | 3/2002 | Camras et al. |

FOREIGN PATENT DOCUMENTS

| WO | WO 00/04593 | 1/2000 |
|---|---|---|
| WO | WO 01/50540 A1 | 7/2001 |

OTHER PUBLICATIONS

Michael Bass, "Handbook of Optics," 1995, Chapter 6.
Max Born and Emil Wolf, "Principles of Optics, 6th Edition," 1980, "Optics of Metals".
European Search Report, 3 pages.

*Primary Examiner*—Vip Patel
*Assistant Examiner*—Kevin Quarterman
(74) *Attorney, Agent, or Firm*—Patent Law Group LLP

(57) ABSTRACT

Light-emitting devices are disclosed that comprise a light source emitting first light, a first material substantially transparent to and located to receive at least a portion of the first light, and particles of a second material dispersed in the first material. The second material has an index of refraction greater than an index of refraction of the first material at a wavelength of the first light. The particles of the second material have diameters less than about this wavelength. Particles of a third material may also be dispersed in the first material.

15 Claims, 4 Drawing Sheets

LIGHT-EMITTING DEVICES UTILIZING NANOPARTICLES

CROSS REFERENCE TO RELATED APPLICATIONS

This application is a Division of U.S. patent application Ser. No. 10/165,571, filed on Jun. 7, 2002, now U.S. Pat. No. 6,870,311, and incorporated herein by reference.

BACKGROUND

1. Field of Invention

The present invention relates to light-emitting devices, and more particularly to semiconductor light-emitting devices.

2. Description of Related Art

Semiconductor light-emitting devices such as light-emitting diodes (LEDs) and laser diodes (LDs) are among the most efficient and robust light sources currently available. Material systems currently of interest in the manufacture of high brightness LEDs capable of operation across the visible spectrum include group III–V semiconductors, particularly binary, ternary, and quaternary alloys of gallium, aluminum, indium, and nitrogen, also referred to as III-nitride materials, and binary, ternary, and quaternary alloys of gallium, aluminum, indium, and phosphorus, also referred to as III-phosphide materials.

A common problem with conventional semiconductor light-emitting devices is that the efficiency with which light may be extracted from such a device is reduced by total internal reflection at interfaces between the device and the surrounding environment followed by reabsorption of the reflected light in the device. Such total internal reflection occurs because the index of refraction of the semiconductor materials from which the device is formed at the emission wavelengths of the device (n~3.5 for III-Phosphide materials, for example) is larger than the index of refraction of the material, typically an epoxy or silicone (n~1.5 or less), in which the device is packaged or encapsulated. Losses due to total internal reflection increase rapidly with the ratio of the refractive index inside the device to that outside the device.

Another aspect of conventional semiconductor light-emitting devices which may be disadvantageous for some applications is that the emission spectrum of such a device typically exhibits a single rather narrow peak (full width at half maximum of about 15 to about 50 nanometers, for example) at a wavelength (peak wavelength) determined by the structure of the light-emitting semiconductor device and by the composition of the materials from which it is constructed. Some applications require a broader emission spectrum than can be directly produced by a conventional light-emitting semiconductor device. For example, some lighting applications require the production of apparently white light. Moreover, the efficiency with which a conventional light-emitting semiconductor device generates light typically varies as the structure and composition of the device is changed to tune the narrow emission spectrum. Consequently, conventional light-emitting semiconductor devices may be unsatisfactory for applications requiring efficient generation of light at particular wavelengths.

One conventional approach to broadening or shifting the emission spectrum of light-emitting semiconductor devices involves using the emission of such a device to excite a phosphor. As used herein, "phosphor" refers to any luminescent material which absorbs light of one wavelength and emits light of a different wavelength. For example, blue light from a light-emitting semiconductor device may be used to excite a yellow emitting phosphor. The resulting yellow light may be mixed with unabsorbed blue light to produce white light. Light-emitting devices in which emission from a semiconductor light-emitting device is converted by a phosphor to another wavelength are typically termed "phosphor converted light-emitting devices." Unfortunately, such phosphor converted light-emitting devices are typically not as efficient as is desired.

What is needed is a semiconductor light-emitting device having improved light extraction, improved phosphor conversion, or both.

SUMMARY

In some embodiments, a light-emitting device comprises a light source emitting first light, a first material substantially transparent to and located to receive at least a portion of the first light, and particles of a second material dispersed in the first material. The second material has an index of refraction greater than an index of refraction of the first material at a wavelength of the first light. The particles have diameters less than about this wavelength, and do not substantially absorb light of this wavelength. The light source may be, for example, a light-emitting semiconductor device.

The light-emitting devices of these embodiments may further comprise particles of a third material dispersed in the first material. The particles of the third material absorb at least a portion of the first light and emit second light having a greater wavelength. The first material and the particles of the second material may together provide a medium having a refractive index that approximately matches that of the third material at a wavelength of the first light.

In some embodiments, a light-emitting device comprises a light source emitting first light, a first material substantially transparent to and located to receive at least a portion of the first light, particles of a second material dispersed in the first material, and particles of a third material dispersed in the first material. The second material has an index of refraction greater than an index of refraction of the first material at a wavelength of the first light. The particles of the second material have diameters less than about this wavelength. The particles of the third material have diameters greater than about this wavelength. The light source may be, for example, a light-emitting semiconductor device.

In some of the latter embodiments, the particles of the second material absorb at least a portion of the first light and emit second light having a greater wavelength. The particles of the third material may also absorb at least a portion of the first light and emit light having a greater wavelength. The first material and the particles of the second material may together provide a medium having a refractive index that approaches or approximately matches that of the third material at a wavelength of the first light.

Light-emitting devices in accordance with some embodiments may be fabricated by a method comprising providing a light source that emits first light, providing a first material in optical communication with the light source, and dispersing particles of a second material in the first material. The first material is substantially transparent to the first light. The second material has an index of refraction greater than an index of refraction of the first material at a wavelength of the first light. The particles of the second material have diameters less than about this wavelength. The dispersing is such that the first material together with the particles of the second material provide a medium having a particular refractive index.

The light-emitting devices disclosed herein may advantageously exhibit increased light extraction from a primary light source, increased light extraction from phosphor particles, and decreased light scattering by phosphor particles compared to conventional light-emitting devices.

BRIEF DESCRIPTION OF THE DRAWINGS

It should be noted that the dimensions in the figures are not necessarily to scale. Like reference numbers in the various figures denote like parts in the various embodiments.

DETAILED DESCRIPTION

Several embodiments of light-emitting devices are disclosed in which nanoparticles are used in combination with light-emitting semiconductor devices. As used herein, "nanoparticle" refers to a particle having a diameter (or similar cross-sectional dimension) typically much less than about one micron. Such nanoparticles may be of any shape and may comprise, for example, crystalline or amorphous solids or liquids.

The inventors have discovered that the efficiency of conventional phosphor-converted light-emitting devices is significantly decreased by scattering by the phosphor particles of both the primary emission from the semiconductor device and the secondary emission from the phosphor particles. A portion of the light scattered by the phosphor particles is scattered onto absorbing parts of the semiconductor device or its package and thereby lost.

Such scattering by the phosphor particles occurs because they are typically substantially larger than the wavelengths of the primary and secondary emitted light, and because the phosphor particles typically have refractive indices at these wavelengths that are much larger than the surrounding medium. For example, conventional phosphor converted light-emitting devices typically utilize phosphor particles having diameters of about 2 microns ($\mu m$) to about 20 $\mu m$. By comparison, visible light is conventionally defined to include wavelengths from about 380 nanometers (nm) to about 770 nm. Such conventional phosphor particles, which typically have indices of refraction of about 1.7 to about 2.3 for visible light, are typically embedded in an epoxy or silicone host material having an index of refraction of about 1.5 at these wavelengths. Theories that describe light-scattering under such circumstances are discussed, for example, in *Handbook of Optics*, (Michael Bass, ed., McGraw Hill, 1995, chapter 6), incorporated herein by reference in its entirety.

Figure 1A:
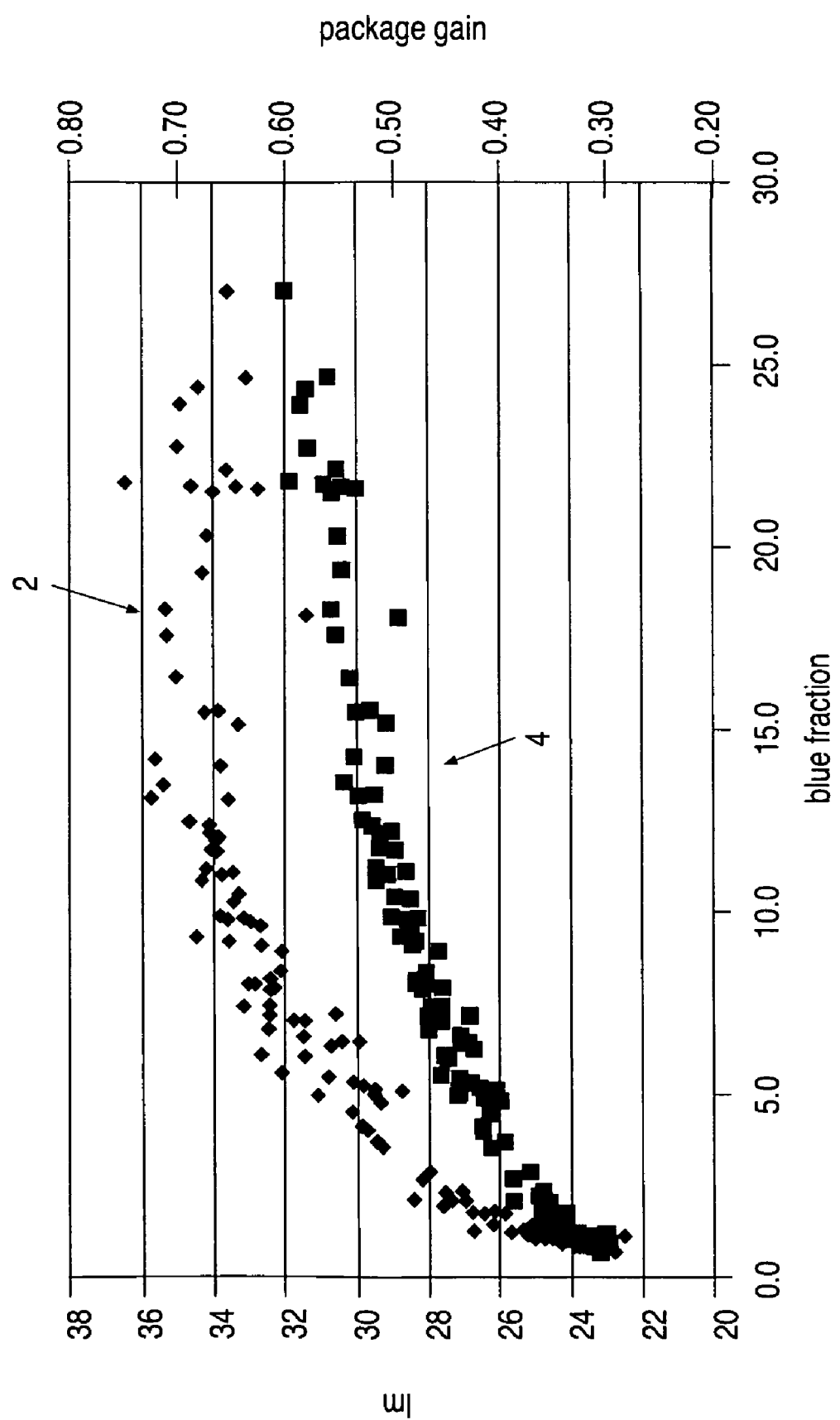
FIG. 1A is a plot illustrating the performance of a phosphor-converted light-emitting device as a function of the volume fraction of approximately 5 micron phosphor particles in a resin.

The effect of such scattering on the efficiency of phosphor converted light-emitting semiconductor devices is shown, for example, in the plot in FIG. 1A. In these devices, blue emission from a III-Nitride light-emitting diode (LED) is converted to green light by europium-doped strontium thiogallate phosphor particles (having diameters of about 4 $\mu m$ to about 5 $\mu m$) dispersed in a silicone resin disposed on the LED. The horizontal axis of the plot, labeled "blue fraction," represents the percentage of the blue light emitted by the LED that is unabsorbed and unconverted and hence present in the total light output of the phosphor-converted device. As the volume percentage of phosphor in the silicone increases, the blue fraction decreases. Hence, the horizontal axis also represents the phosphor loading in the resin, with the phosphor loading decreasing along the axis from left to right.

The left vertical axis of the plot represents the total light output, in lumens (lm), of the phosphor converted device. The right vertical axis, labeled "package gain," represents a scaling factor by which a theoretical prediction of the total light output, based on the known characteristics of the LED and of the phosphor and neglecting scattering, must be multiplied to match the measured performance of the phosphor converted devices. An ideal device would have a "package gain" of one. Hence, the right vertical axis measures the degree to which scattering by the phosphor particles has degraded the performance of the device. In particular, lower values of "package gain" indicate increased losses due to scattering. Diamond shaped data points 2 indicate the relationship between the phosphor loading and the total light output. Square shaped data points 4 similarly indicate the relationship between the phosphor loading and losses due to scattering by the phosphor particles.

The inventors have determined from the data shown in FIG. 1A and from the results of similar measurements that in conventional phosphor converted light-emitting devices losses due to scattering by large phosphor particles embedded in a lower refractive index host material increase as the volume fraction of the particles in the host material increases. From similar measurements the inventors have also determined that losses due to scattering also increase if the refractive index of the phosphor particles is increased and the volume fraction of phosphor particles and the type of host material is unchanged. Typically, about 50% of the total light power of a conventional phosphor-converted light-emitting device is lost due to scattering by the phosphor particles followed by absorption.

Figure 1B:
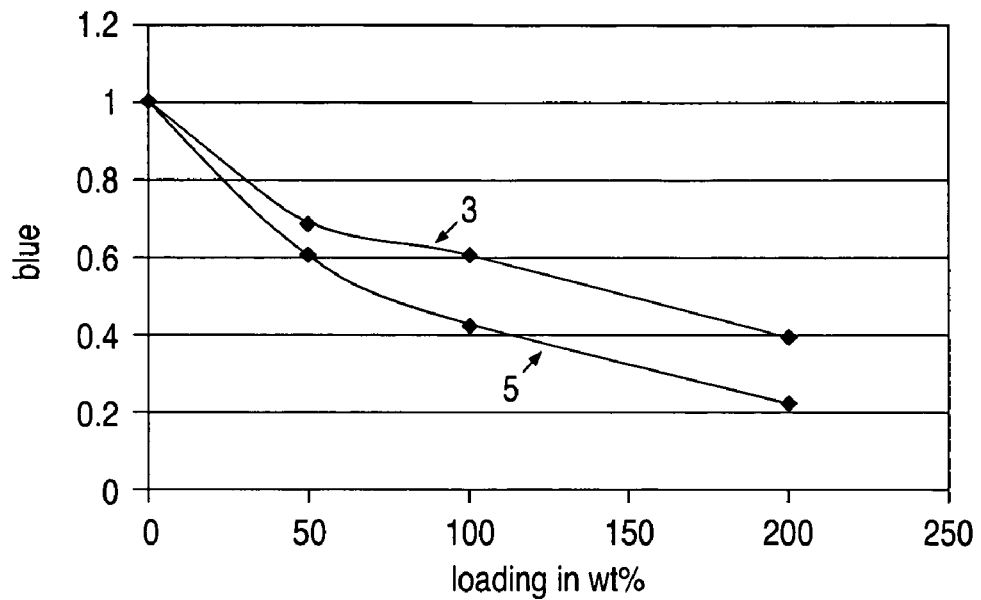
FIG. 1B is a plot illustrating the performance of resin encapsulated light-emitting diodes as a function of the weight % of non-absorbing scattering particles dispersed in the resin.

Even in test devices in which the phosphor particles were replaced with a similar concentration of non-absorbing particles having sizes comparable to those of conventional phosphor particles, about 10% to about 20% of the blue emission was lost by scattering onto absorbing portions of the device. For example, FIG. 1B plots normalized blue emission from III-Nitride LEDs encapsulated in silicone resin (vertical axis) versus the weight % of non-absorbing scattering particles dispersed in the resin. Curve 3 represents devices in which the non-absorbing particles were approximately 5 μm BaSO₄ particles. Curve 5 represents devices in which the non-absorbing particles were approximately 2 μm YOS particles. Blue emission decreases rapidly with increasing particle loading in the encapsulant for both sets of devices.

The inventors believe that the significant losses due to scattering by phosphor particles in conventional phosphor-converted light-emitting devices and especially their causes have gone unnoticed by others.

The inventors have recognized that scattering by phosphor particles of primary emission from a semiconductor device and of secondary emission from the phosphor particles themselves may be reduced by reducing the size of the phosphor particles to substantially below wavelengths (e.g., peak wavelengths) of the primary and secondary emission. For example, semiconductor nanocrystals or semiconductor quantum dots, which typically have a diameter less than about 10 nm and hence scatter little of the primary and secondary light, may be used as substantially non-scattering phosphors. The use of semiconductor nanocrystals and quantum dots to phosphor convert the output of a light-emitting semiconductor device is disclosed in U.S. Pat. No. 6,501,091 and in U.S. Pat. No. 6,803,719, both of which are incorporated herein by reference in their entirety. These references do not recognize, however, the significant losses due to scattering by large phosphor particles in conventional phosphor converted light-emitting devices and the consequent advantages to be realized by using non-scattering phosphor particles instead.

The inventors have also recognized that light scattering by phosphor particles in phosphor converted light-emitting devices may be reduced by increasing the refractive index of the medium in which they are embedded to more closely match the refractive index of the phosphor particles. In particular, the inventors have discovered that the desired increase in refractive index of the medium surrounding the phosphor particles may be accomplished by dispersing nanoparticles that are smaller than wavelengths (e.g., peak wavelengths) of the primary and secondary emission into the host material in which the phosphor particles are embedded. The nanoparticles are chosen to have a refractive index greater than that of the host material. Due to their size, however, the nanoparticles scatter little of the emitted light.

The increase in refractive index accomplished by dispersing higher refractive index nanoparticles into a lower refractive index host material may be understood in terms of effective medium theory. Effective medium theories, such as those discussed in *Principles of Optics*, Sixth Edition, (Max Born and Emil Wolf, Pergamon Press, 1980, chapter 2), incorporated herein by reference in its entirety, describe the optical and dielectric properties of a mixture in terms of the properties of its constituent components. The refractive index of a mixture, for example, may be well approximated by a volume weighted average of the refractive indices of its components if the mixture may be treated as a host material including non-scattering portions of other materials. Under such circumstances, the refractive index n of a medium formed by the mixture of volumes $v_i$ of components having refractive indices $n_i$ may be given by equation (1):

$$n = \frac{\sum_i v_i n_i}{\sum_i v_i} \quad (1)$$

As an example, for the case of nanoparticles of a material such as cerium oxide or titanium oxide having a refractive index of about 2.3 to about 2.4 dispersed in an epoxy or silicone having a refractive index of about 1.5, equation (1) indicates that the refractive index of the mixture varies from about 1.5 to about 1.8 as the volume fraction of the nanoparticles in the mixture varies from about 0 to about 0.35. The upper limit on the refractive index of such a mixture is set by the dispersability of the nanoparticles in the host material as well as by the refractive indices of the nanoparticles and of the host material. The inventors believe, for example, that cerium oxide and titanium oxide nanoparticles may be dispersed in silicone to volume fractions exceeding about 30% to about 40%. Hence, the refractive index of such a mixture may be adjusted such that, for example, conventional doped yttrium aluminum garnet (YAG) phosphor particles, which typically have an index of refraction of about 1.8, would not substantially scatter light if dispersed in the mixture.

The inventors have also discovered that light extraction from a light-emitting semiconductor device may be increased by dispersing nanoparticles that are smaller than a wavelength (e.g., peak wavelength) of the light emitted by the device into a host material and disposing the mixture on or around the light-emitting semiconductor device. The nanoparticles are chosen to have a refractive index greater than that of the host material. Light extraction is increased compared to that for a similar semiconductor light-emitting device encapsulated in only the host material because the increased refractive index of the mixture reduces losses due to total internal reflection.

In addition, the inventors have discovered that light extraction from phosphor particles dispersed in a host material can be increased by also dispersing in the host material nanoparticles that are smaller than a wavelength (e.g., a peak wavelength) of the light emitted by the phosphor particles. The nanoparticles are chosen to have an index of refraction greater than that of the host material. Light extraction from the phosphor particles is increased compared to that for phosphor materials dispersed in only the host material because of the increased refractive index of the surrounding medium. For similar reasons, the inventors expect light extraction from phosphor particles having diameters less than about a wavelength (e.g., a peak wavelength) of the light emitted by the phosphor particles to increase as the concentration of the particles in the host material is increased.

Suitable light-emitting semiconductor devices that may be used in combination with nanoparticles in accordance with embodiments of the present invention include, but are not limited to, devices formed from III-Nitrides, III-Phosphides, III-Arsenides, and combinations thereof. These devices may be, for example, light-emitting diodes or laser diodes and may emit light at ultraviolet, visible, or infrared wavelengths. Suitable light-emitting semiconductor devices are disclosed, for example, in U.S. Pat. No. 6,133,589, U.S. Pat. No. 6,229,160, and U.S. Pat. No. 6,486,499, all three of which are incorporated herein by reference in their entirety.

Figure 2:
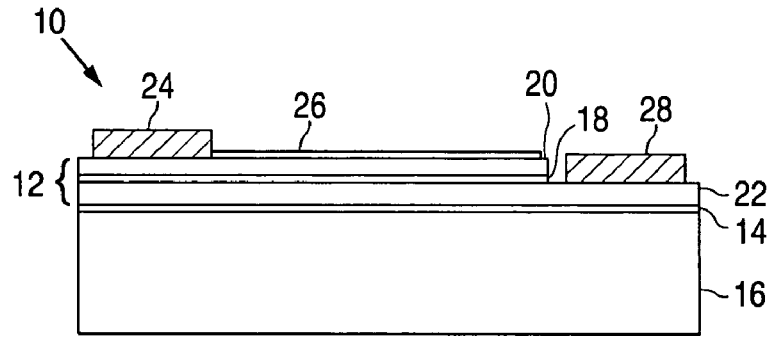
FIG. 2 is a schematic diagram of a light-emitting diode employed in some embodiments.

Referring to FIG. 2, for example, embodiments of the present invention may employ $Al_xIn_yGa_zN$ based LED 10. LED 10 includes a multilayered epitaxial structure 12 disposed on a buffer layer 14, which in turn is disposed on substrate 16. Substrate 16 may be formed, for example, from sapphire ($Al_2O_3$), silicon carbide, or a III-Nitride material. Epitaxial structure 12 includes active region 18 disposed between p-type upper $Al_xIn_yGa_zN$ region 20 and lower $Al_xIn_yGa_zN$ region 22. $Al_xIn_yGa_zN$ region 22 includes n-type and/or undoped $Al_xIn_yGa_zN$ layers. Active region 18 includes one or more quantum wells formed from layers of $Al_xIn_yGa_zN$. Ohmic p-contact 24 and metallic layer 26 are electrically coupled to each other and to upper $Al_xIn_yGa_zN$ region 20. Ohmic n-contact 28 is electrically coupled to lower $Al_xIn_yGa_zN$ region 22. Application of a suitable forward bias across contacts 24 and 28 results in injection of electrons and holes into active region 18. Radiative recombination of electrons and holes in active region 18 generates light. In one implementation, metallic layer 26 is semitransparent to light emitted by active region 18. In another implementation, metallic layer 26 is highly reflective to light emitted by active region 18, and LED 10 is mounted as a flip-chip with contacts 24 and 28 facing a submount. It should be understood that the composition of $Al_xIn_yGa_zN$ may vary between the various layers and regions in LED 10.

Figure 3:
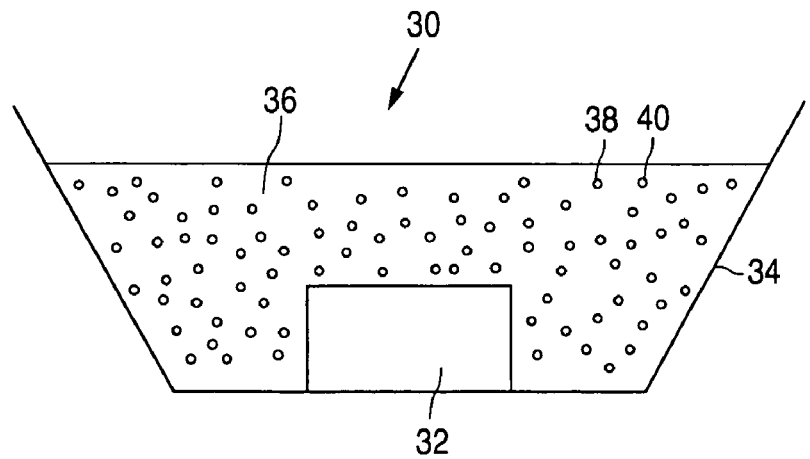
FIG. 3 is a schematic diagram of a light-emitting device in which nanoparticles are dispersed in a material disposed around a light-emitting semiconductor device in accordance with some embodiments.

In one embodiment (FIG. 3), a light-emitting device 30 includes a light-emitting semiconductor device 32 disposed in a reflective cup 34. Reflective cup 34 also contains a material 36 that is substantially transparent to light emitted by device 32. Nanoparticles 38 having an index of refraction greater than that of material 36 at wavelengths of light emitted by device 32 are dispersed in substantially transparent material 36. Nanoparticles 38 are selected to have diameters less than about a wavelength (e.g., a peak wavelength) of light emitted by device 32 and hence do not substantially scatter the emitted light. 1 Preferably, nanoparticles 38 have diameters less than about ¼ of a peak emission wavelength of device 32. For example, in some implementations nanoparticles 38 have diameters of about 2 nm to about 50 nm and device 32 emits light having wavelengths greater than about 400 nm. Reflective cup 34 reflects light emitted by light-emitting semiconductor device 32 to form an optical output of light-emitting device 30. In other embodiments, discussed below, optional phosphor particles 40 shown in FIG. 3 are also dispersed in material 36.

The term "substantially transparent" is used herein to indicate that a material so described transmits light at a peak wavelength emitted by device 32 with less than about 25%, preferably less than about 10%, more preferably less than about 2%, single pass loss due to absorption or scattering. Material 36 may be organic or inorganic and may comprise, for example, materials including but not limited to conventional epoxies, acrylic polymers, polycarbonates, silicone polymers, optical glasses, chalcogenide glasses, spiro compounds, and mixtures thereof.

In some implementations, nanoparticles 38 do not substantially absorb light at wavelengths emitted by device 32, particularly at peak emission wavelengths. The phrases "not substantially absorb" and "not substantially absorbing" are used herein to indicate that the nanoparticles in such implementations are sufficiently non-absorbing that they do not increase the single pass loss of light transmitted by the encapsulant to more than about 30%, preferably not to more than about 20%. One of ordinary skill in the art will understand that the loss due to absorption by the nanoparticles of light emitted by device 32 will depend on the absorption cross-sections of the individual nanoparticles, the concentration of the nanoparticles in substantially transparent material 36, and possibly on interactions between the nanoparticles and the surrounding material. Suitable nanoparticles for such implementations may include, but are not limited to, nanoparticles of metal oxides, nitrides, nitridosilicates, and mixtures thereof. Suitable metal oxides may include, but are not limited to, calcium oxide, cerium oxide, hafnium oxide, titanium oxide, zinc oxide, zirconium oxide, and combinations thereof. Nanoparticles of such metal oxides having sizes ranging, for example, from about 2 nm to about 10 nm are available, for example, from Degussa-Huls AG of Frankfurt/Main Germany. Suitable nanoparticles for such implementations may also include nanoparticles of II–VI semiconductors such as zinc sulfide, zinc selenide, cadmium sulfide, cadmium selenide, cadmium telluride, and their ternary or quaternary mixtures, and nanoparticles of III–V semiconductors such as III-nitrides, III-phosphides, and mixtures thereof. Such semiconductor nanoparticles have size tunable absorption spectra, as disclosed, for example, in U.S. Pat. No. 6,501,091 and in U.S. Pat. No. 6,803,719. Hence, the sizes of the semiconductor nanoparticles may be chosen such that the nanoparticles do not substantially absorb at wavelengths emitted by device 32.

In other implementations, nanoparticles 38 absorb at least a portion of the primary light emitted by light-emitting semiconductor device 32 and emit secondary light of either longer or shorter wavelength than the absorbed light. Hence, in these implementations nanoparticles 38 act as phosphors. Suitable nanoparticles for such implementations may include, but are not limited to, nanoparticles of the II–VI and III–V materials listed above with sizes chosen such that the nanoparticles absorb a portion of the primary light.

In some implementations nanoparticles 38 may be dispersed in material 36 with conventional mixing techniques used in fabricating conventional phosphor converted light-emitting devices and well known to one of ordinary skill in the art. For example, a conventional three roll mill may be used to disperse nanoparticles in a silicone material. In other implementations, nanoparticles may be dispersed in chalcogenide and optical glasses, for example, by heating the glass to a molten state, adding the nanoparticles as a powder, and stirring the mixture using methods conventional in the glass making arts. In addition, one of ordinary skill in the art will recognize that some semiconductor nanoparticles may be grown or synthesized in a glass by conventional glass-making techniques used in the fabrication of color glass filters.

The volume fraction (concentration) of nanoparticles 38 in material 36 may be chosen in some implementations such that nanoparticles 38 together with material 36 provide a medium having a particular refractive index. The approximate volume fraction of nanoparticles 38 in material 36 needed to provide a desired refractive index may be determined using effective medium theory as explained above. The volume fraction of nanoparticles 38 in material 36 may then be varied around the calculated value to determine the volume fraction that provides a mixture having the particular desired refractive index.

In some implementations, the volume fraction of nanoparticles 38 in material 36 may vary from about 20% to about 60%. As demonstrated above for the example of cerium oxide or titanium oxide nanoparticles in a silicone, nanoparticles 38 together with material 36 may provide a medium having a refractive index greater than about 1.6, preferably greater than about 1.8, at a peak wavelength of the primary emission from light-emitting semiconductor device 32, for example.

One of ordinary skill in the art will recognize that material 36 and nanoparticles 38 may be disposed in reflective cup 34 by a variety of well known methods.

Light extraction from light-emitting semiconductor device 32 may be advantageously increased compared to that for a similar light-emitting device encapsulated in material 36 because the increased refractive index of the mixture of nanoparticles 38 and material 36 may decrease losses due to total internal reflection at the interfaces of device 32 and material 36. This increase in light extraction from device 32 may be accomplished without increasing scattering of the emitted light.

In addition, nanoparticles 38 may advantageously phosphor convert all of or a portion of the primary emission from semiconductor light-emitting device 32 to provide a desired total emission from light-emitting device 30. For example, nanoparticles 38 and their volume fraction in material 36 may be chosen by conventional methods used in fabricating phosphor converted light-emitting devices such that the emission from nanoparticles 38 combines with unabsorbed emission from device 32 to provide white light. If necessary, mixing of primary emission from device 32 and secondary emission from nanoparticles 38 may be facilitated, for example, by roughening a surface of any element of light-emitting device 30.

In another embodiment (still referring to FIG. 3), additional phosphor particles 40 are dispersed in material 36. Typically, phosphor particles 40 have a refractive index greater than that of material 36 at wavelengths of light emitted by light-emitting semiconductor device 32. Phosphor particles 40 may be dispersed in material 36 in combination with nanoparticles 38 that do not substantially absorb light emitted by device 32 or in combination with nanoparticles 38 that absorb a portion of the light emitted by device 32 and emit secondary light.

In some implementations, phosphor particles 40 have diameters greater than about a wavelength (e.g., a peak wavelength) of light emitted by device 32. Suitable phosphor particles for such implementations include, but are not limited to, particles of materials comprising yttrium aluminum garnets, sulfur substituted gallates, unsubstituted gallates, sulfur substituted aluminates, unsubstituted aluminates, phosphates, silicates (nitridosilicates, for example), selenides, sulfides, and mixtures thereof. These materials may be doped with (activated by), for example, rare earth ions including but not limited to cerium and europium ions. Phosphor particles 40 may also comprise other conventional phosphor materials known to one of ordinary skill in the art.

In other implementations, phosphor particles 40 have diameters less than about a wavelength (e.g., a peak wavelength) of light emitted by light-emitting semiconductor device 32. Suitable nanoparticles for such implementations may include, but are not limited to, nanoparticles of the II–VI and III–V materials listed above with sizes chosen such that the nanoparticles absorb a portion of the primary light. Phosphor particles 40 may also be or include organic dye molecules.

Phosphor particles 40 may be dispersed in material 36 in combination with nanoparticles 38 by conventional techniques such as those described above. Phosphor particles 40 and their volume fraction in material 36 may be chosen by conventional methods used in fabricating phosphor converted light-emitting devices such that light-emitting device 30 provides a desired output emission spectrum such as, for example, white light.

The increased refractive index of the mixture of nanoparticles 38 and material 36 compared to that of material 36 alone may advantageously decrease light scattering by and increase light extraction from phosphor particles 40. In particular, as the refractive index of the mixture approaches that of phosphor particles 40, light scattering by the phosphor particles decreases toward zero and light extraction from the phosphor particles is optimized.

In some implementations, nanoparticles 38 and their volume fraction in material 36 may be chosen such that nanoparticles 38 and material 36 together provide a medium having a refractive index at a wavelength (e.g. a peak wavelength) of emission from device 32 or from phosphor particles 40 that approximately matches the refractive index of phosphor particles 40 at the same wavelength. In such implementations, the choice of nanoparticles 38 and their volume fraction in material 36 may be guided by effective medium theory similarly to as explained above. For example, the refractive index of a mixture of silicone and cerium oxide or titanium oxide nanoparticles may be adjusted as described above to match that of YAG based phosphor particles to within about 10% to about 2% or better.

In other implementations, the refractive index of the mixture of nanoparticles 38 and material 36 or the size of phosphor particles 40 may be adjusted so as to provide a desired amount of light scattering by phosphor particles 40. For example, in some implementations the refractive index of the mixture is adjusted so that light scattering by phosphor particles 40 is set to a minimum level needed to facilitate mixing of light emitted by light-emitting semiconductor device 32, phosphor particles 40, and (optionally) nanoparticles 38.

In another embodiment (FIG. 4), a light-emitting device 42 includes a light-emitting semiconductor device 32 disposed in a reflective cup 34, and a layer 44 of material 36 disposed on one or more surface of device 32. Nanoparticles 38 and, optionally, phosphor particles 40 are dispersed in material 36. Material 36, nanoparticles 38, and phosphor particles 40 may be provided, for example, in any of the combinations described above with respect to light-emitting device 30 (FIG. 3). Similarly, the incorporation of nanoparticles 38 into light-emitting device 42 may provide any of the previously described advantages.

Layer 44 may be deposited, for example, by conventional spraying, screen printing, and dipping methods. In one implementation, layer 44 may be a conformal layer applied with a stenciling method described in U.S. Pat. No. 6,650,044 incorporated herein by reference in its entirety.

In another embodiment (light-emitting device 46, FIG. 5), material 36 is formed into a lens (or other optical element) as shown or provided in, for example, a hollow shell shaped as a lens or other optical element and disposed around light-emitting device 32. Material 36, nanoparticles 38, and (optional) phosphor particles 40 may be provided, for example, in any of the combinations described above. Material 36 may be formed into a lens or other shape using conventional encapsulation methods familiar to one of ordinary skill in the art. In addition to the advantages provided by nanoparticles 38 and described above, the lens shaped portion of light-emitting device 46 reduces losses due to total internal reflection and, in combination with reflector 34, forms an optical output of light-emitting device 46.

Figure 6:
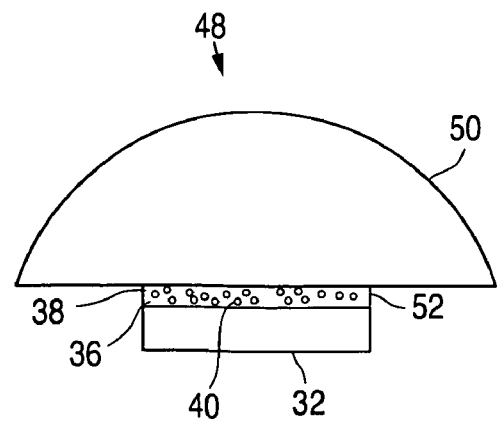
FIG. 6 is a schematic diagram of a light-emitting device in which nanoparticles are dispersed in a layer of material that attaches an optical element to a light-emitting semiconductor device in accordance with some embodiments.

In another embodiment (light emitting device 48, FIG. 6), a lens or other optical element 50 is attached to a light-emitting semiconductor device 32 with a layer 52 of material 36. Nanoparticles 38, and (optional) phosphor particles 40 may be dispersed in material 36, for example, in any of the combinations described above. In one implementation, material 36 is a high refractive index glass having a relatively low melting point, and optical element 50 is bonded to light-emitting semiconductor device 32 with layer 52 by a wafer-bonding method such as, for example, those disclosed in U.S. patent application Ser. No. 09/660,317, incorporated herein by reference in its entirety. This reference also discloses additional materials that may be suitable for use as material 36 in layer 52, and materials from which optical element 50 may be advantageously formed. Light extraction from light-emitting semiconductor device 32 may be advantageously increased by forming optical element 50 from a material having a relatively high refractive index.

Figure 4:
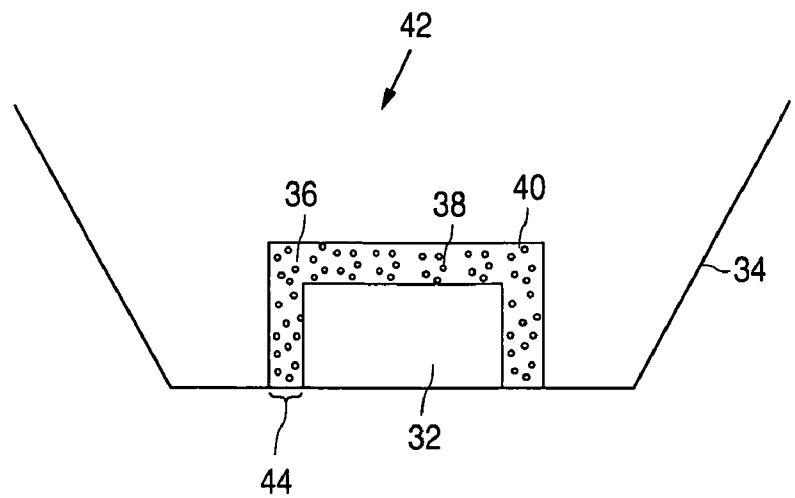
FIG. 4 is a schematic diagram of a light-emitting device in which nanoparticles are dispersed in a layer of material disposed on a light-emitting semiconductor device in accordance with some embodiments.
Figure 5:
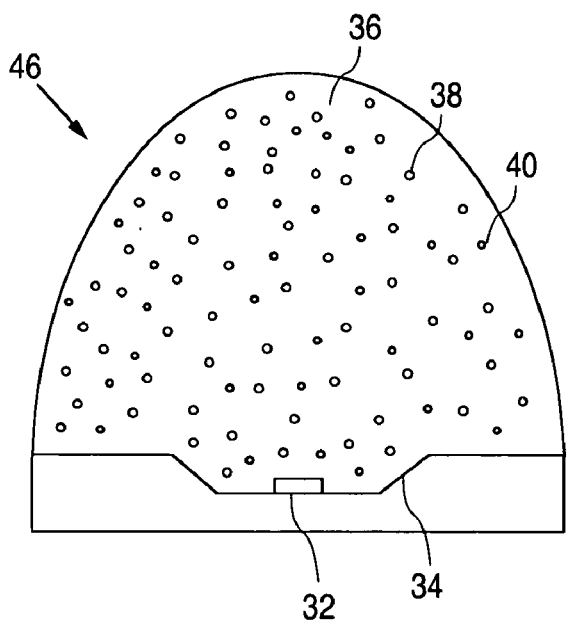
FIG. 5 is a schematic diagram of a light-emitting device in which nanoparticles are dispersed in a material shaped as a lens in accordance with some embodiments.
Figure 7:
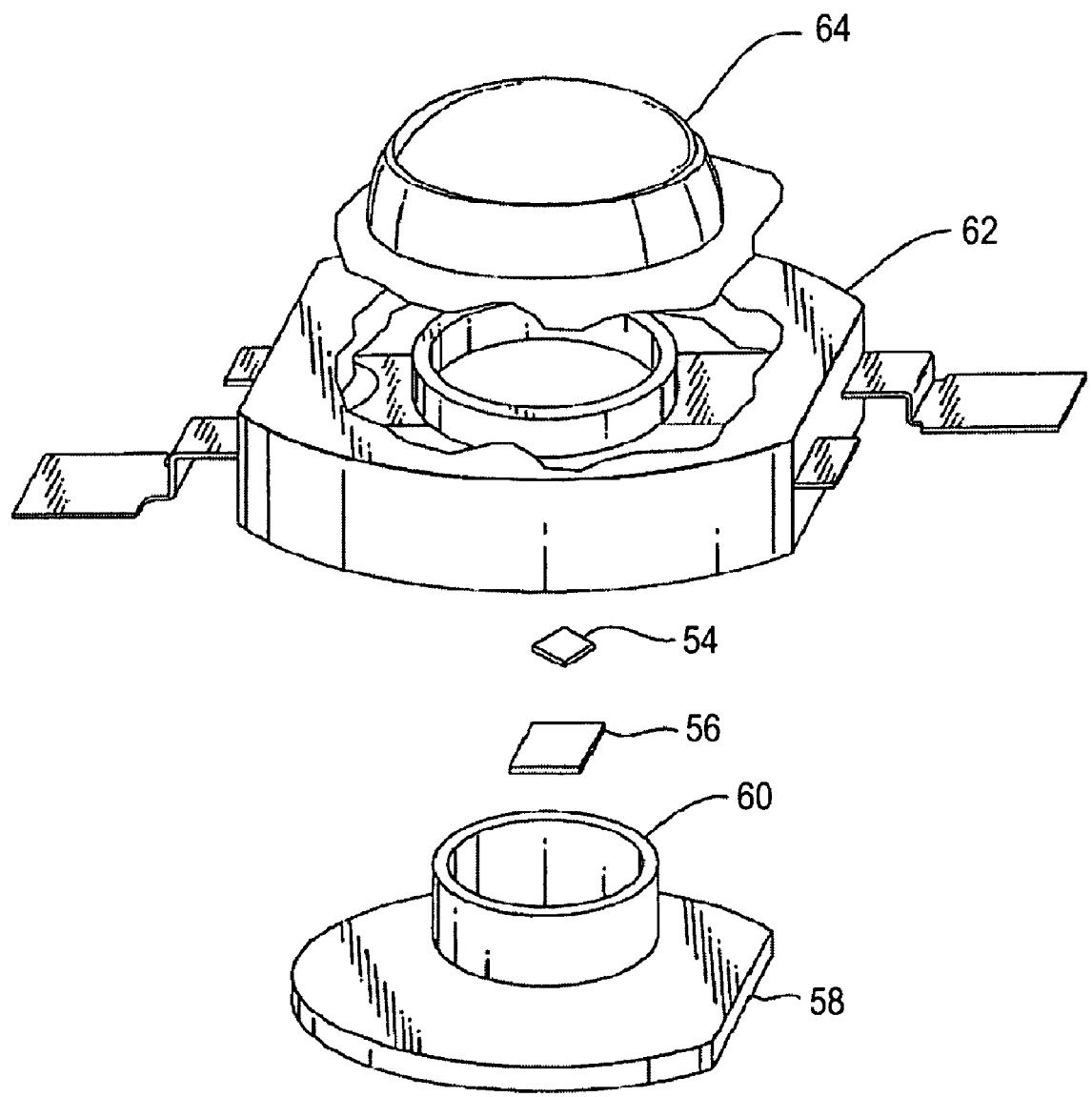
FIG. 7 is an exploded view of a light-emitting device incorporated into a package in accordance with some embodiments.

FIG. 7 is an exploded view of a packaged light-emitting device in accordance with some embodiments. Light emitting device 54, which may be any of the light-emitting devices described herein or a light-emitting semiconductor device component of such a light-emitting device, is mounted directly or indirectly via a thermally conducting submount 56 to a heat-sinking slug 58. Slug 58 may include an optional reflector cup 60, which may be in addition to or substitute for reflector 34 (FIGS. 3–5). Slug 58 is placed into an insert-molded leadframe 62. Insert-molded leadframe 62 is, for example, a filled plastic material molded around a metal frame that provides an electrical path to light-emitting device 54. A lens 64 or other optical element may be added. Lens 64 may be in addition to or substitute for the lenses shown in FIGS. 5 and 6.

While the present invention is illustrated with particular embodiments, the invention is intended to include all variations and modifications falling within the scope of the appended claims. For example, nanoparticles may be employed as described above to reduce scattering by phosphor particles of light provided by light sources other than light-emitting semiconductor devices, and to improve light extraction from such light-sources. Alternative light sources include, for example, lasers, conventional incandescent lamps, and fluorescent lamps.

In addition, although material 36 including nanoparticles 38 and (optionally) phosphor particles 40 is shown in the figures as disposed directly on light-emitting semiconductor device 32, in other embodiments material 36 may be spaced apart from device 32. For example, in some embodiments material 36 may be spaced apart from device 32 by a transparent spacer layer as disclosed in U.S. Pat. No. 5,959,316, incorporated herein by reference in its entirety. Moreover, although the embodiments illustrated in FIGS. 3–5 each include a reflector 34, some other embodiments do not include such a reflector. Although lenses employed in several embodiments have been illustrated as dome-shaped, such lenses may have other shapes or may be implemented, for example, with a microlens array.

What is claimed is:

1. A method of fabricating a light-emitting device, said method comprising:
   providing a light source that emits first light;
   providing a first material in optical communication with said light source, said first material substantially transparent to said first light;
   dispersing particles of a second material in said first material, said second material having an index of refraction greater than an index of refraction of said first material at a wavelength of said first light, said particles having diameters less than about said wavelength; and
   dispersing particles of a third material in said first material wherein said dispersing is such that said first material together with said particles of said second material and said third material provide a medium having a particular refractive index.

2. The method of claim 1, wherein said light source comprises a light-emitting semiconductor device.

3. The method of claim 1, wherein said refractive index is greater than about 1.6.

4. The method of claim 1, further comprising disposing said first material on at least a portion of said light source.

5. The method of claim 1, wherein said first material comprises a material selected from the group consisting of epoxies, silicones, acrylic polymers, polycarbonates, optical glasses, chalcogenide glasses, spiro compounds, and mixtures thereof.

6. The method of claim 1, wherein said second material comprises a material selected from the group consisting of metal oxides, nitridosilicates, nitrides, II–VI compounds, III–V compounds, organic dyes, and mixtures thereof.

7. The method of claim 1, wherein said particles of said second material have diameters of about 2 nm to about 50 nm.

8. The method of claim 1, wherein said particles of said second material do not substantially absorb light of said wavelength.

9. The method of claim 1, wherein said particles of said second material absorb at least a portion of said first light and emit second light having a wavelength greater than said wavelength of said first light.

10. The method of claim 1, wherein said particles of said third material have diameters less than about said wavelength of said first light.

11. The method of claim 1, wherein said particles of said third material have diameters greater than about said wavelength of said first light.

12. The method of claim 1, wherein said particles of said third material absorb at least a portion of said first light and emit second light having a wavelength greater than said wavelength of said first light.

13. The method of claim 1, wherein said refractive index of said medium approximately matches a refractive index of said third material at said wavelength of said first light.

14. The method of claim 1, further comprising bonding an optical element to said semiconductor light-emitting device with at least a portion of said first material therebetween.

15. The method of claim 14, wherein said optical element includes a lens.

* * * * *